United States Patent
Chou

[19]

[11] Patent Number: 5,923,958
[45] Date of Patent: Jul. 13, 1999

[54] METHOD FOR SEMICONDUCTOR CHIP PACKAGING

[75] Inventor: Li-Kun Chou, Taipei Hsien, Taiwan

[73] Assignee: Pan Pacific Semiconductor Co., Ltd., Taipei, Taiwan

[21] Appl. No.: 09/085,450

[22] Filed: May 28, 1998

Related U.S. Application Data

[51] Int. Cl.[6] ............ H01L 21/44; H01L 21/48; H01L 21/50
[52] U.S. Cl. .................. 438/118; 438/106; 438/116
[58] Field of Search .............................. 438/118, 116, 438/106

[56] References Cited

U.S. PATENT DOCUMENTS 5,403,783  4/1995  Nakanishi et al. ................. 438/118
5,471,027  11/1995  Call et al. ........................ 438/119
5,744,863  4/1998  Culnane et al. .

*Primary Examiner*—Kevin M. Picardat
*Assistant Examiner*—Devon Collins
*Attorney, Agent, or Firm*—Rosenberg, Klein & Bilker

[57] ABSTRACT

A method for semiconductor chip packaging comprises the following processes: preparing an array-typed base plane by pressing a plane-shaped material, wherein said array-typed base plane comprises a plurality of single-united base surrounded and defined by latticed dams; mounting a already-cut die to each said base unit on said array-typed base plane, and adhering said die to said base unit; wire-bonding said mounted die; applying adhesive paste to top surface of each said dam, and covering the resultant structure with a transparent lid to ensure the hermeticity of the package; cutting said array-typed base plane to a plurality of single-united base. By above-mentioned process, the manufacturing cost can be reduced and the yield can also be enhanced.

6 Claims, 3 Drawing Sheets

METHOD FOR SEMICONDUCTOR CHIP PACKAGING

FIELD OF THE INVENTION

The present invention relates to a packaging method for semiconductor chip, by which the packaging cost can be reduced and the yield can be enhanced.

BACKGROUND OF THE INVENTION

Over the past decade, packaging becomes increasingly important for microelectronic devices. As the density of semiconductor devices is increasing, the requirement of compactness and reduced-cost for packaging is more demanding. Several new packaging approaches have been proposed to achieve above objects. For examples, a very fine quad flatpack (VFQFP) technology has been developed to improve I/O density and provide very fine pitch QTPs and solder ball grid array.

Another technology competing with the VFQFP is the solder ball grid array (BGA) technology. A plurality of solder balls or solder columns are arranged between ceramic package and the PCB. The solder ball can achieve the function of electrical connection and accommodating the thermal stress due to the TCE mismatch therebetween.

FIG. 1 shows the flowchart of conventional ceramic BGA packaging process. First, the ceramic base of a single-unit form is subjected to polishing. The semiconductor die is then mounted on and adhered to the single-united ceramic base by adhesive paste such as silver epoxy. The mounted die is then subjected to a curing process and a wire-bonding process. Afterward, a transparent lid is covered the resultant structure for providing hermeticity. The sealed package is then subjected a testing process for rejecting those packages unsatisfactory.

However, the above-mentioned process has several problems. The cost is hard to reduce because the high cost of ceramic base. Moreover, the process is begun with a ceramic base of single-united form, and the successive processes need to carry out for each independent ceramic base. This is impedimental to the batch manufacture and laborious. Moreover, there are many processes involving a high temperature step, the die is liable to be damaged and the yield will be accordingly reduced.

SUMMARY OF THE PRESENT INVENTION

The object of the present invention is to provide an improved packaging method for semiconductor chip, by which the manufacturing cost can be simplified, the material cost can be saved, as well as the yield can be enhanced.

In order to achieve above objects, the packaging method for semiconductor chip comprises the following steps:

preparing an array-typed base plane by pressing a ceramic or plastic plane-shaped material, wherein the array-typed base plane comprises a plurality of single-united base surrounded and defined by latticed dams;

mounting a already-cut die to each base unit on the array-typed base plane, and adhering the die to the base unit;

wire-bonding the mounted die;

applying adhesive paste to top surface of each dam, and covering the resultant structure with a transparent lid to protect the die from being damaged;

cutting the array-typed base plane to a plurality of single-united base.

To enable better understanding of the objectives, configuration, structure or device characteristics and functions of the subject invention, please refer to the following detailed description with drawings.

DETAILED DESCRIPTION OF PREFERRED EMBODIMENT

Figure 1:
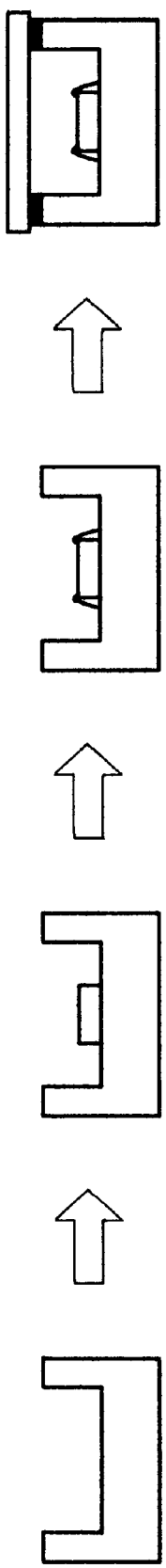
FIG. 1 is the flowchart explaining the conventional manufacturing process of a ceramic BGA.
Figure 2:
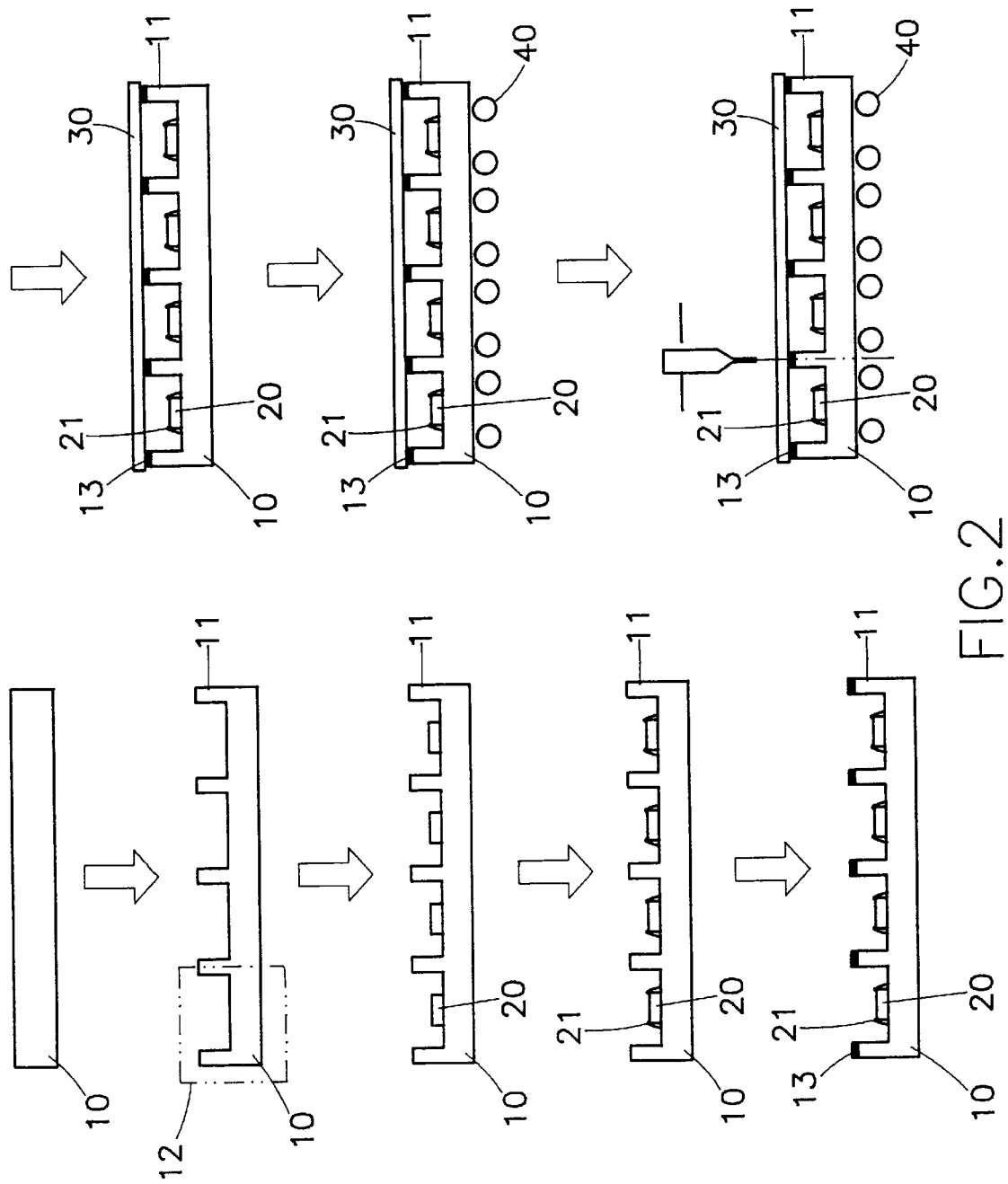
FIG. 2 is the flowchart explaining the manufacturing process of the preferred embodiment according to the present invention.
Figure 3:
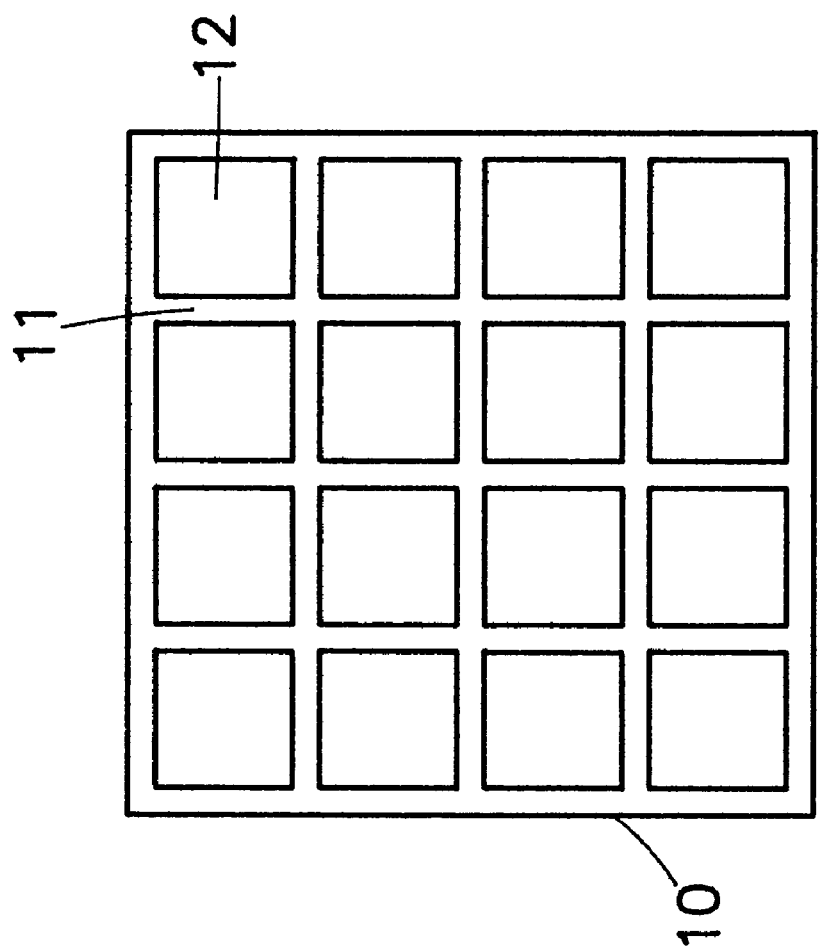
FIG. 3 is the top view of the array-typed base plane of the preferred embodiment according to the present invention.

The above and other features and objects of the present invention will be more apparent by explaining a preferred embodiment thereof in conjunction of the accompanying drawings. FIG. 2 is the flowchart explaining the manufacturing process of the preferred embodiment according to the present invention. The packaging method of the preferred embodiment according to the present invention comprises following steps:

preparing an array-typed base plane 10 by pressing a plastic plane-shaped material, wherein the array-typed base plane 10 comprises a plurality of single-united bases 12 surrounded and defined by latticed dams 11 (as shown in FIG. 3);

mounting a already-cut die 20 to each unit base 12 on the array-typed base plane 10, and adhering the die 20 to the unit base 12;

wire-bonding the mounted die with wire 21;

applying adhesive paste 13 to top surface of each dam 11, and covering the resultant structure with a transparent lid 30 to protect the die from being damaged;

forming a solder grid ball array 40 on the back side of the array-typed base plane 10;

cutting the array-typed base plane 10 to a plurality of single-united base 12.

As can be seen from above-mentioned process, the processes such as chip mounting, lid covering, and grid ball array forming are carried out on the whole array-typed base plane before the cutting process by which the array-typed base plane is cut into a plurality of single-united base. The packaging process can be undertaken in a batch-processing manner. Therefore, the packaging cost is greatly reduced and the yield is also enhanced. Moreover, the packaging cost can be more effectively saved by using a larger base plane.

The method can be advantageously applied to the packaging of components such as contact-type image sensor, charge coupled device, and digital signal camera. The market competition can be enhanced by reducing the packaging cost.

Although the present invention has been described with reference to the two preferred embodiments thereof, it will be understood that the invention is not limited to the details thereof. Various substitutions and modifications have suggested in the foregoing description, and other will occur to those of ordinary skill in the art. For example, the plastic base plane can be replaced by a ceramic base plane, the transparent lid can be formed of glass, and the adhesive paste can be applied to the transparent lid instead of the top surface of each dam. All such substitutions and modifications are intended to be embraced within the scope of the invention as defined in the appended claims.

I claim:

1. A method of semiconductor chip packaging, comprising the steps of:

pressing a planar material to define a single base member having an array of a plurality of unit bases formed in one piece formation therein, each of said plurality of unit bases being surrounded and defined by a lattice of a plurality of dams extending from a surface of said base;

affixing a plurality of precut semiconductor dice to said base member, each die of said plurality of dice being mounted to a respective one of said plurality of unit bases of said base member;

wire-bonding leads to each of said plurality of mounted dice;

applying an adhesive paste to a top surface of each of said plurality of dams;

covering said top surface of each of said plurality of dams and said applied adhesive with a single lid member to provide a hermetic closure for each of said plurality of unit bases;

cutting said covered base member intermediate each of said plurality of dams to form a plurality of individual unit bases, each of said individual defining a semiconductor package.

2. The method of semiconductor chip packaging as in claim 1, wherein said step of covering includes the step of forming a ball grid array on a back side of said base member prior to said step of cutting.

3. The method of semiconductor chip packaging as in claim 1, wherein said step of pressing is preceded by the step of providing said base member formed of a plastic material.

4. The method of semiconductor chip packaging as in claim 1, wherein said step of pressing is preceded by the step of providing said base member formed of ceramic material.

5. The method of semiconductor chip packaging as in claim 1, wherein said step of covering is preceded by the step of providing said lid member formed of glass.

6. A method of semiconductor chip packaging, comprising the steps of:

pressing a planar material to define a single base member having an array of a plurality of unit bases formed in one piece formation therein, each of said plurality of unit bases being surrounded and defined by a lattice of a plurality of dams extending from a surface of said base;

affixing a plurality of precut semiconductor dice to said base member, each die of said plurality of dice being mounted to a respective one of said plurality of unit bases of said base member;

wire-bonding leads to each of said plurality of mounted dice;

providing a single lid member;

applying an adhesive paste to said lid member in correspondence to said plurality of dams;

covering a top surface of each of said plurality of dams with said single lid member to form a closure for said plurality of unit bases, said applied adhesive paste providing hermeticity to said closure;

cutting said covered base member intermediate each of said plurality of dams to form a plurality of individual unit bases, each of said individual defining a semiconductor package.

* * * * *